(12) United States Patent
Tsubaki et al.

(10) Patent No.: US 9,379,085 B2
(45) Date of Patent: Jun. 28, 2016

(54) WIRE BONDING STRUCTURE OF SEMICONDUCTOR DEVICE AND WIRE BONDING METHOD

(75) Inventors: Ryuji Tsubaki, Kyoto (JP); Yasufumi Matsuoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1242 days.

(21) Appl. No.: 13/018,993

(22) Filed: Feb. 1, 2011

(65) Prior Publication Data
US 2011/0241224 A1 Oct. 6, 2011

(30) Foreign Application Priority Data
Mar. 31, 2010 (JP) .................................. 2010-080288

(51) Int. Cl.
*H01L 23/48* (2006.01)
*H01L 21/60* (2006.01)
(Continued)

(52) U.S. Cl.
CPC .............. *H01L 24/85* (2013.01); *B23K 20/005* (2013.01); *H01L 24/48* (2013.01); *H01L 24/78* (2013.01); *H01L 23/3121* (2013.01); *H01L 24/45* (2013.01); *H01L 2224/45124* (2013.01); *H01L 2224/45147* (2013.01); *H01L 2224/4846* (2013.01); *H01L 2224/48091* (2013.01); *H01L 2224/48247* (2013.01); *H01L 2224/48455* (2013.01); *H01L 2224/48472* (2013.01); *H01L 2224/48699* (2013.01); *H01L 2224/78313* (2013.01); *H01L 2224/78314* (2013.01); *H01L 2224/85181* (2013.01); *H01L 2224/85205* (2013.01); *H01L 2924/014* (2013.01); *H01L 2924/01004* (2013.01); *H01L 2924/01005* (2013.01); *H01L 2924/01006* (2013.01); *H01L 2924/01013* (2013.01); *H01L 2924/01023* (2013.01); *H01L 2924/01029* (2013.01); *H01L 2924/01033* (2013.01); *H01L 2924/01074* (2013.01); *H01L 2924/01082* (2013.01); *H01L 2924/12032* (2013.01)

(58) Field of Classification Search
CPC ................ H01L 23/48; H01L 23/4952; H01L 23/49575; H01L 21/4889; H01L 21/4825; H01L 23/49811; H01L 23/52; H01L 24/42; H01L 24/44; H01L 24/45; H01L 24/46; H01L 24/47; H01L 24/48
USPC .................................................. 257/784, 786
See application file for complete search history.

(56) References Cited

U.S. PATENT DOCUMENTS

2005/0224924 A1* 10/2005 Koh et al. ...................... 257/666
2006/0017141 A1* 1/2006 Luo et al. ...................... 257/666
2006/0138617 A1* 6/2006 Miyaki et al. ................. 257/666
(Continued)

FOREIGN PATENT DOCUMENTS

JP 2006-114649 4/2006

*Primary Examiner* — Peniel M Gumedzoe
(74) *Attorney, Agent, or Firm* — Hamre, Schumann, Mueller & Larson, P.C.

(57) ABSTRACT

A wire bonding structure is provided which includes a wire having a first bonding portion and a second bonding portion. The first bonding portion is bonded to an electrode pad of a semiconductor element, whereas the second bonding portion is bonded to a pad portion of a lead. The first bonding portion includes a front bond portion, a rear bond portion, and an intermediate portion sandwiched between these two bond portions. The front bond portion and the rear bond portion are bonded to the electrode pad more strongly than the intermediate portion is. In the longitudinal direction of the wire, the second bonding portion is smaller than the first bonding portion in bonding length.

19 Claims, 11 Drawing Sheets

(51) Int. Cl.
*B23K 37/04* (2006.01)
*B23K 1/20* (2006.01)
*B23K 3/08* (2006.01)
*H01L 23/00* (2006.01)
*B23K 20/00* (2006.01)
*H01L 23/31* (2006.01)

(56) References Cited

U.S. PATENT DOCUMENTS

2007/0018338 A1* 1/2007 Hosseini ............... H01L 23/488
257/784
2007/0141755 A1* 6/2007 Luechinger .................. 438/123
2007/0172980 A1* 7/2007 Tanaka et al. ................ 438/106

* cited by examiner

WIRE BONDING STRUCTURE OF SEMICONDUCTOR DEVICE AND WIRE BONDING METHOD

BACKGROUND OF THE INVENTION

1. Field of the Invention

The present invention relates to a wire bonding structure used for e.g. a semiconductor device. The present invention also relates to a semiconductor device including the wire bonding structure. The present invention further relates to a wire bonding method, and a bonding tool used for the method.

2. Description of the Related Art

FIGS. 15 and 16 show an example of wire bonding method using a conventional bonding tool (see JP-A-2006-114649, for example). As shown in FIG. 15, the bonding tool 90 includes a wedge 91, a wire guide 92 and a cutter 93. The wedge 91 is supported by a horn (not shown) for supplying ultrasonic vibration. The wire guide 92 serves to guide a wire 96 to the end of the wedge 91. The wedge 91 applies ultrasonic vibration under pressure to the wire 96 sandwiched between the end of the wedge 91 and a bonding target, whereby the wire 96 and the bonding target are bonded together. Thereafter, the wire 96 is cut with a cutter 92.

In the above-described wire bonding method, as shown in FIG. 15, a semiconductor element 98 is first mounted on a lead 97A, and then first bonding is performed with respect to the electrode pad 98a of the semiconductor element 98. Specifically, wedge 91 applies ultrasonic vibration to the wire 96 while pressing the wire 96 against the electrode pad 98a. This process allows the wire 96 to be bonded to the electrode pad 98a, whereby the first bonding portion 96A shown in FIG. 16 is provided. Then, second bonding is performed with respect to a pad portion 97Ba of the lead 97B. Specifically, as shown in FIG. 16, the bonding tool 90 is moved to a position directly above the lead 97B. Then, the wedge 91 applies ultrasonic vibration to the wire 96 while pressing the wire 96 against the pad portion 97Ba. This process allows the wire 96 to be bonded to the pad portion 97Ba, whereby the second bonding portion 96B is provided.

To prevent the wire 96 from becoming separated from the electrode pad 98a, it is desirable to make the first bonding portion 96A large. To achieve this, the wedge 91 needs to be made large, and accordingly, the pad portion 97Ba for the second bonding needs to be made large. However, an increase in size of the pad portion 97Ba is disadvantageous for the size reduction of the entire semiconductor device.

SUMMARY OF THE INVENTION

The present invention has been proposed under the circumstances described above. It is therefore an object of the present invention to provide a technique that contributes to size reduction of electronic components such as a semiconductor device.

The wire bonding structure provided according to a first aspect of the present invention comprises a wire including a first bonding portion bonded to a first bonding target and a second bonding portion bonded to a second bonding target. The first bonding portion includes a front bond portion, a rear bond portion, and an intermediate portion sandwiched between the front bond portion and the rear bond portion. The front bond portion is closer to the second bonding portion than the rear bond portion is. Both of the front bond portion and the rear bond portion are bonded to the first bonding target more strongly than the intermediate portion is. The second bonding portion is smaller than the first bonding portion in bonding length in the longitudinal direction of the wire.

Preferably, the intermediate portion is spaced apart from the first bonding target.

Preferably, the intermediate portion is in contact with the first bonding target.

Preferably, the second bonding portion is equal to the rear bond portion of the first bonding portion in bonding length in the longitudinal direction of the wire.

Preferably, the wire is made of aluminum.

The semiconductor device provided according to a second aspect of the present invention comprises: the wire bonding structure in accordance with the above-described first aspect; a semiconductor element including an electrode pad as the first bonding target; a lead including a pad portion as the second bonding target; and a resin package covering the semiconductor element and the wire bonding structure.

The bonding tool provided according to a third aspect of the present invention comprises: a wire guide; and a wedge including a front pressing surface and a rear pressing surface for pressing a wire fed through the wire guide against a bonding target. The front pressing surface is closer to the wire guide than the rear pressing surface is. The wedge is formed with a gap sandwiched between the front pressing surface and the rear pressing surface.

Preferably, the front pressing surface and the rear pressing surface are provided by an inner surface of a guide groove formed in the wedge.

Preferably, the gap is defined by an auxiliary groove extending perpendicularly to the guide groove.

Preferably, the bonding tool further comprises a cutter opposite to the wire guide with respect to the wedge. The cutter is movable relative to the wedge in the direction in which the wire is pressed.

Preferably, the wire used for the bonding tool is made of aluminum.

The wire bonding method provided according to a fourth aspect of the present invention uses the bonding tool in accordance with the above-described third aspect. The bonding method comprises: a first bonding step of bonding the wire to a first bonding target by applying ultrasonic vibration with the wire pressed against the first bonding target by the front pressing surface and the rear pressing surface; and a second bonding step of bonding the wire to a second bonding target by applying ultrasonic vibration with the wire pressed against the second bonding target by the rear pressing surface, without using the front pressing surface.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

FIGS. 1-12 show an example of wire bonding method using a bonding tool according to the present invention.

Figure 2:
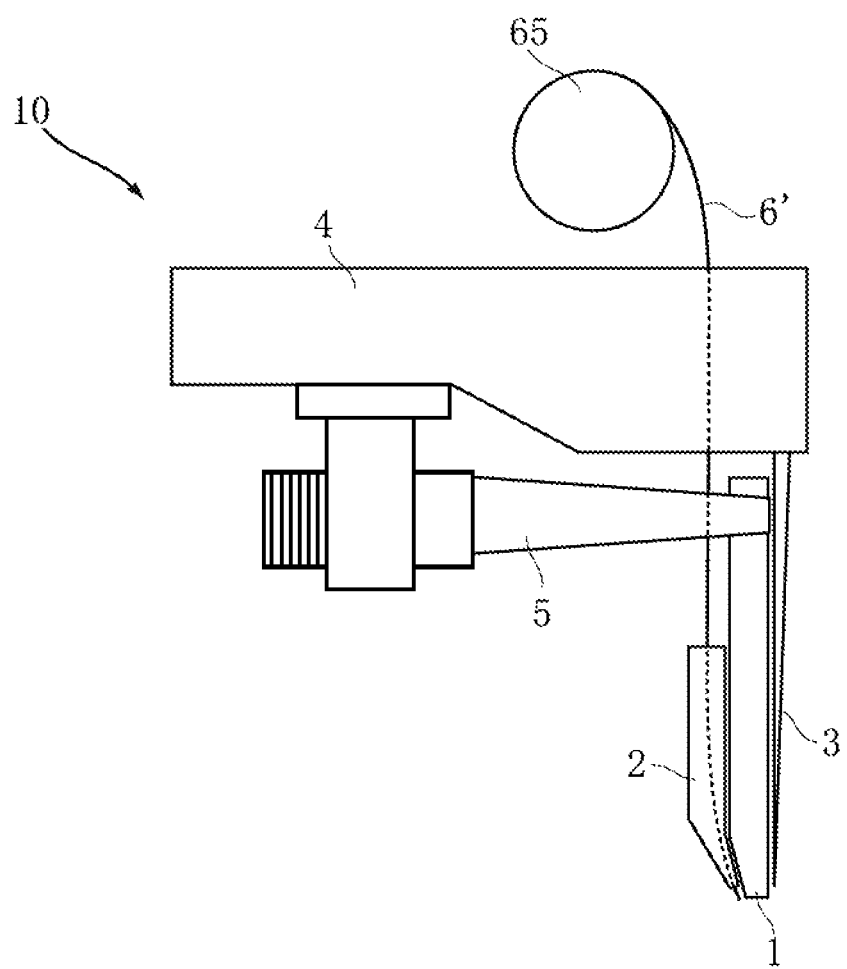
FIG. 2 is aside view schematically showing the entirety of the bonding tool.

As shown in FIG. 2, the bonding tool 10 includes a wedge 1, a wire guide 2, a cutter 3, a support 4 and a horn 5. The horn 5 holds the wedge 1 and functions to apply ultrasonic vibration while pressing the wedge 1 against a bonding target. The horn 5 is supported by the support 4. In this embodiment, the horn 5 is attached to the support 4 via a resilient support member.

The wire guide 2 is fixed to the wedge 1. The wire guide 2 serves to guide a wire 6', which may be paid out from a wire reel 65, toward the wedge 1. The wire 6' is made of e.g., aluminum. Alternatively, the wire 6' may be made of aluminum alloy or copper or copper alloy, for example. In the description given below, front and rear sides are defined with reference to the wedge 1 such that the wire guide 2 is provided on the "front" side of the wedge, and the opposite side is the rear side.

Figure 3:
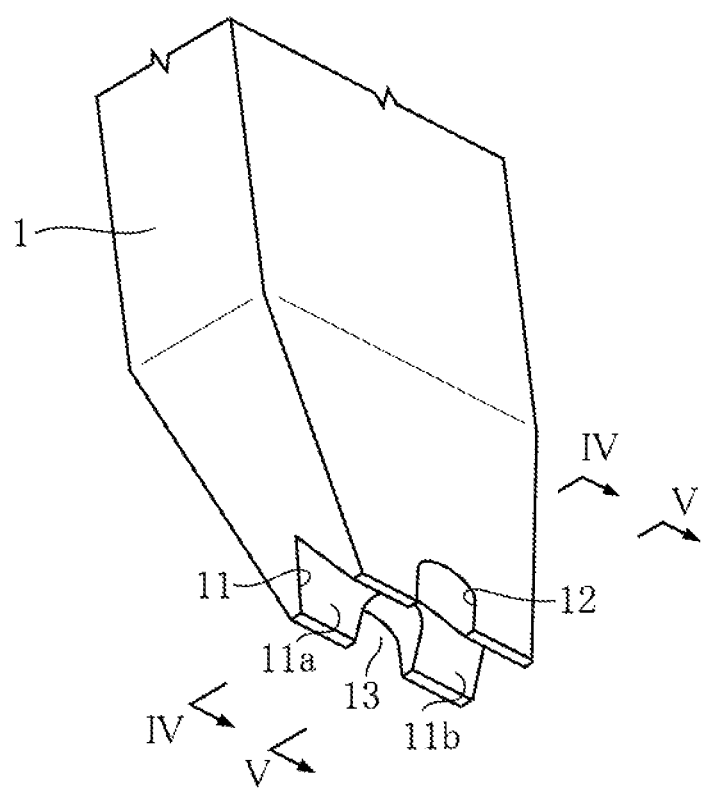
FIG. 3 is a perspective view showing details of a wedge of the bonding tool.
Figure 4:
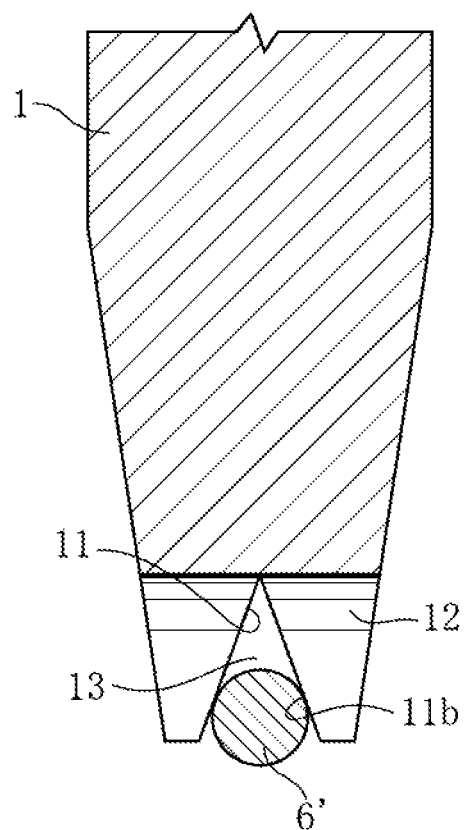
FIG. 4 is a sectional view taken along lines IV-IV in FIG. 3.
Figure 5:
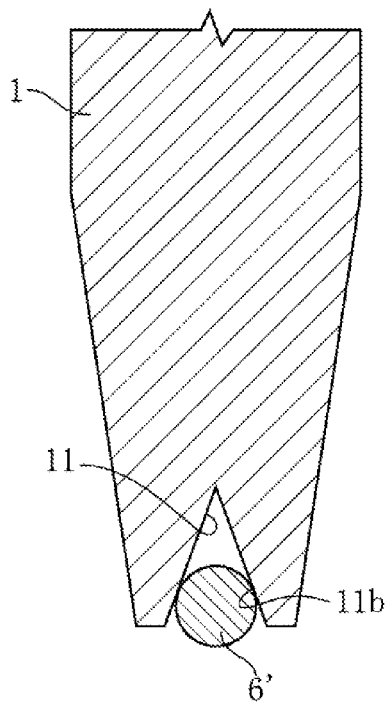
FIG. 5 is a sectional view taken along lines V-V in FIG. 3.

The wedge 1 is a member for pressing the wire 6' against a bonding target and bonding the wire 6' to the bonding target by ultrasonic vibration. For instance, the wedge 1 is made of tungsten carbide. As shown in FIGS. 3-5, the wedge 1 has a guide groove 11 at the lower end which extends in the front-rear direction and has an inverted V shape in cross section. Also, a pair of cutouts 12 are formed on the opposite sides of the guide groove 11. These cutouts 12 can be provided by e.g. forming an auxiliary groove extending perpendicularly to the guide groove 11 at the lower end of the wedge 1. Each of the cutouts 12 is provided approximately at the center of the lower end of the wedge 1 and semielliptical, for example. Of the inner surface of the guide groove 11, the portion on the front side of the cutouts 12 constitutes a front pressing surface 11a, whereas the portion on the rear side of the cutouts 12 constitutes a rear pressing surface 11b. These two cutouts 12 define a gap 13. The gap 13 is positioned between the front pressing surface 11a and the rear pressing surface 11b. In this embodiment, the front pressing surface 11a, the rear pressing surface 11b and the gap 3 are substantially equal in length in the front-rear direction.

The cutter 3 is provided for cutting the wire 6' and arranged on the rear side of the wedge 1. In this embodiment, the cutter 3 is fixed to the support 4.

A wire bonding method using the wire bonding tool 10 is described below.

Figure 1:
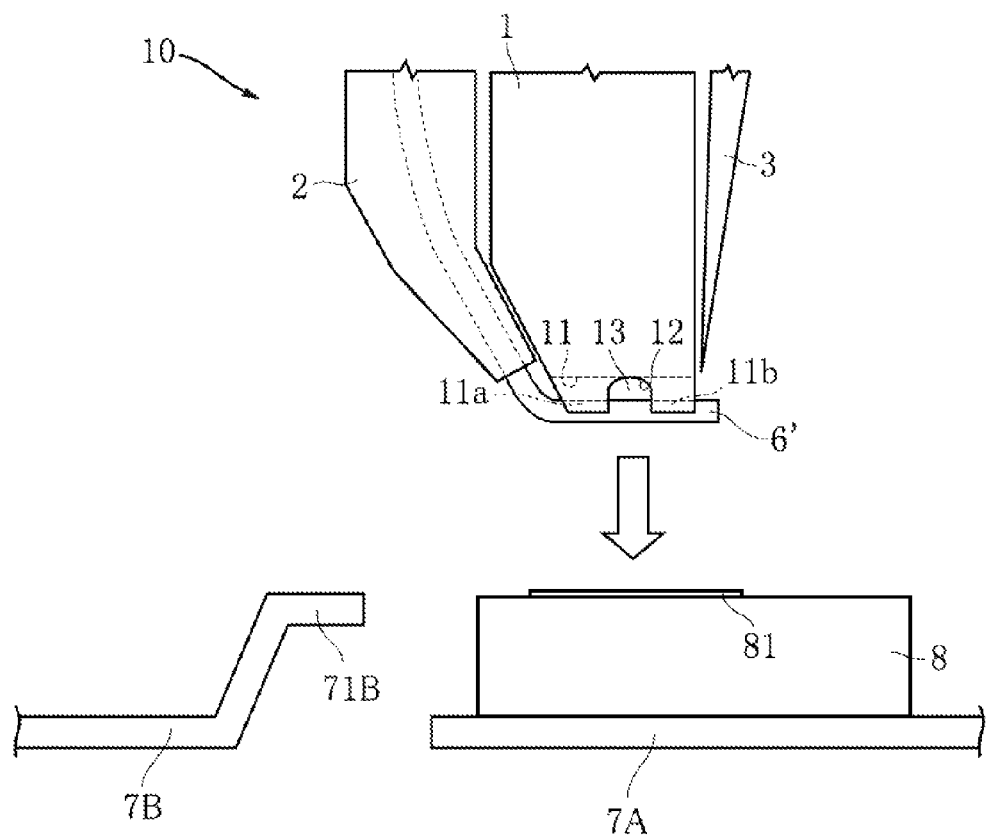
FIG. 1 is a side view showing the state where first bonding is to be started in an example of wire bonding method using a bonding tool according to the present invention.

As shown in FIG. 1, the wire bonding method of this embodiment is to connect an electrode pad 81 of a semiconductor element 8 mounted on a lead 7A and a pad portion 71B of a lead 7B via a wire 6'. However, this is merely an example, and the wire bonding method of the present invention is applicable to the connection of members different from the illustrated ones.

First, as shown in FIG. 1, with the leading end of the wire 6' held in the guide groove 11, the wedge 1 of the bonding tool 10 is arranged directly above the electrode pad 81. Then, the end of the wedge 1 is moved toward the electrode pad 81.

Figure 6:
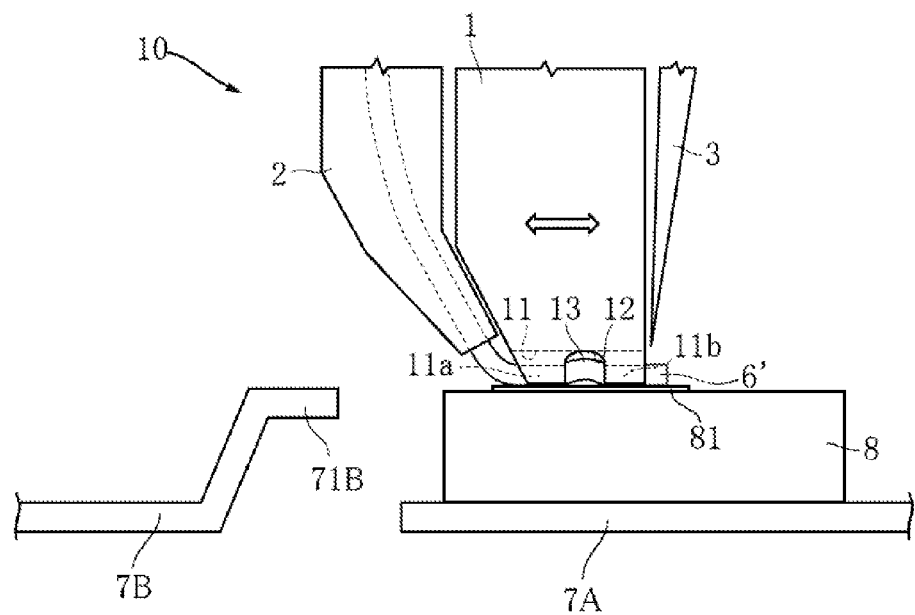
FIG. 6 is a side view showing a first bonding step in the wire bonding method.
Figure 7:
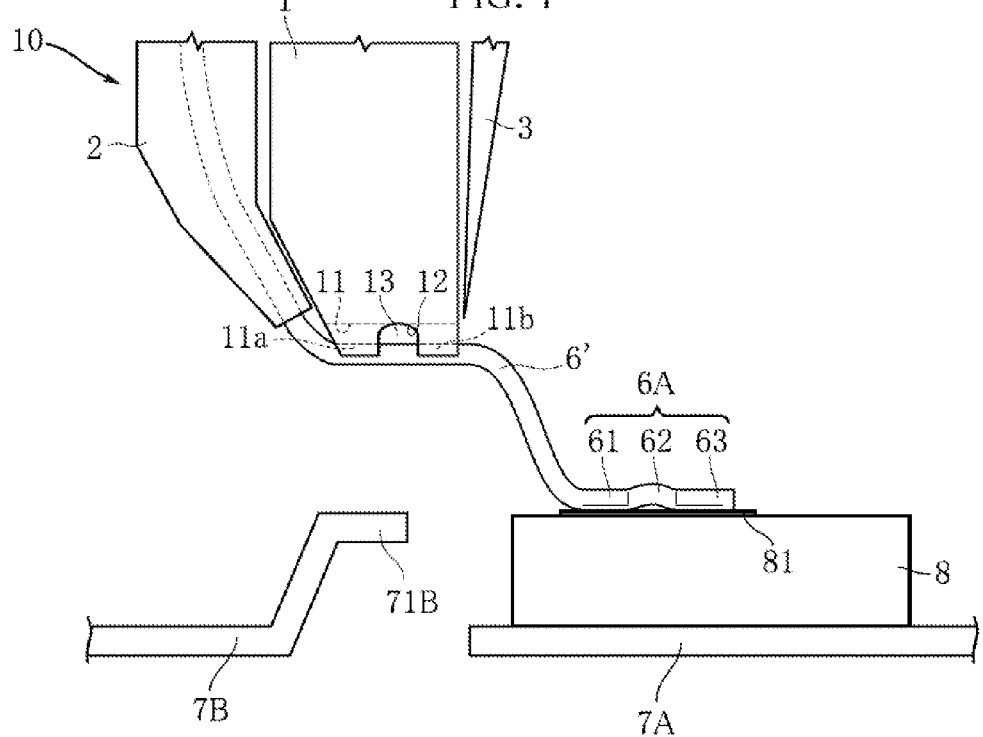
FIG. 7 is a side view showing the state where the first bonding step is finished.

Then, first bonding is performed as shown in FIG. 6. Specifically, with the wedge 1 pressed against the electrode pad 81, ultrasonic vibration is applied to the wire 6'. By this process, the leading edge of the wire 6' is welded to the electrode pad 81. More specifically, two portions of the wire 6' which are spaced apart from each other are welded to the electrode pad 81. The two portions are the portion sandwiched between the front pressing surface 11a and the electrode pad 81, and the portion sandwiched between the rear pressing surface 11b and the electrode pad 81. On the other hand, the portion positioned within the gap 13 is hardly pressed against the electrode pad 81. As a result, as shown in FIG. 7, a first bonding portion 6A is provided which includes a front bond portion 61 bonded by the front pressing surface 11a, a rear bond portion 63 bonded by the rear pressing surface 11b, and an intermediate portion 62. Since the intermediate portion 62 is a portion that has been positioned within the gap 13, the intermediate portion 62 is not welded to the electrode pad 81. In this embodiment, the intermediate portion 62 has an arch-like shape slightly raised above the electrode pad 81.

Figure 8:
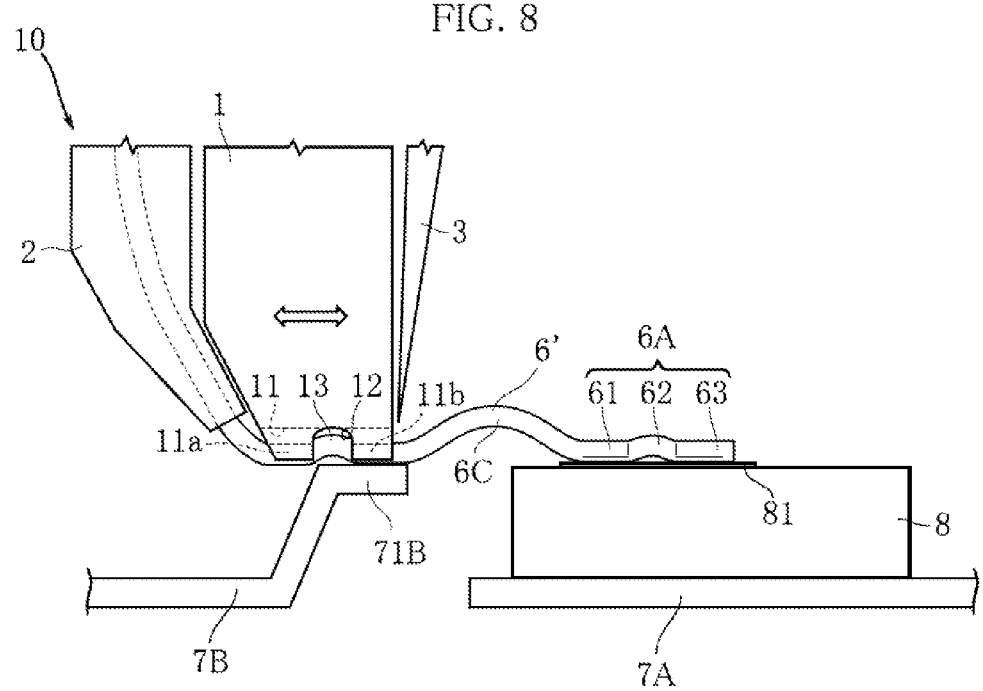
FIG. 8 is a side view showing a second bonding step in the wire bonding method.

As shown in FIG. 8, after the above-described first bonding, second bonding is performed with respect to the pad portion 71B of the lead 7B. Specifically, the position of the wedge 1 is adjusted so that only the rear pressing surface 11b is pressed against the pad portion 71B. At this time, the gap 13 is positioned directly above the front end of the pad portion 71B (i.e., the boundary between the horizontal surface and the inclined surface), and the front pressing surface 11a of the wedge 1 is spaced forward from the front end of the pad portion 71B. In this state, ultrasonic vibration is applied to the wire 6' by the wedge 1. By this process, the wire portion sandwiched between the rear pressing surface 11b and the pad portion 71B is welded to the pad portion 71B, whereby a second bonding portion 6B (FIG. 9) is formed.

Figure 9:
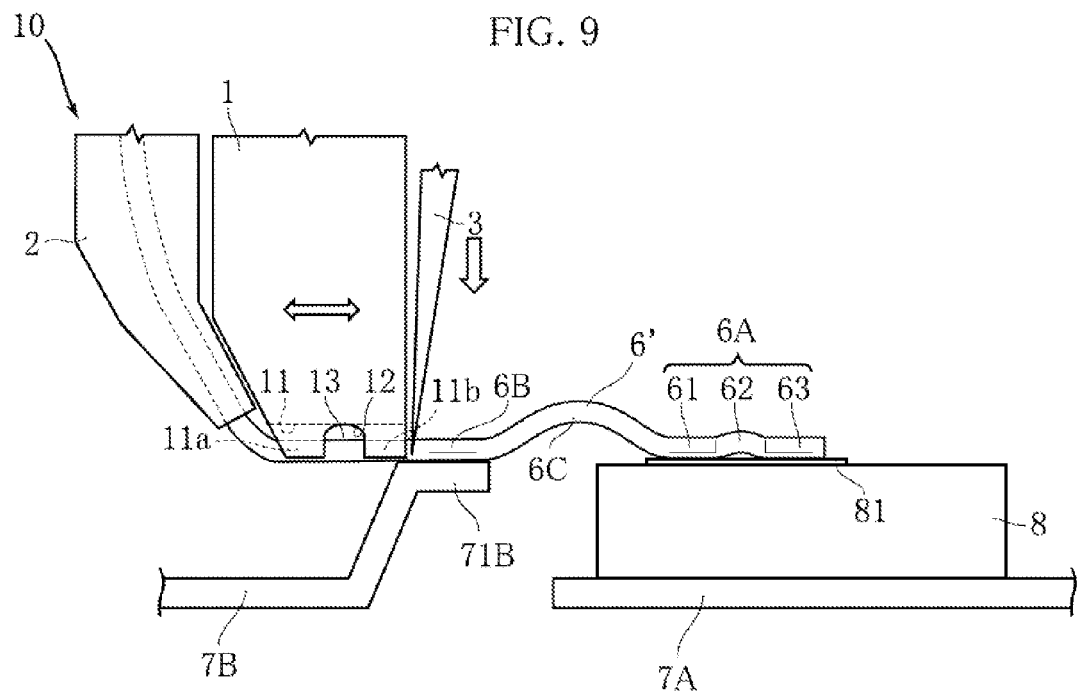
FIG. 9 is a side view showing the step of cutting a wire in the wire bonding method.

Then, as shown in FIG. 9, the bonding tool 10 is moved forward to position the lower end of the cutter 3 between the front end of the second bonding portion 6B and the front end of the pad portion 71B. Between these two ends, the wire 6' is not welded to the pad portion 71B. When the support 4 is pushed down, the cutter 3 fixed to the support 4 moves downward together with the support 4 to form a cut in the wire 6'. In this embodiment, however, the amount of the downward movement of the support 4 is set so that the cutter 3 does not completely cut the wire 6'. The wedge 1, which is resiliently attached to the support 4, does not excessively bite into the lead 7B, even if it comes into contact with the lead 7B.

Figure 10:
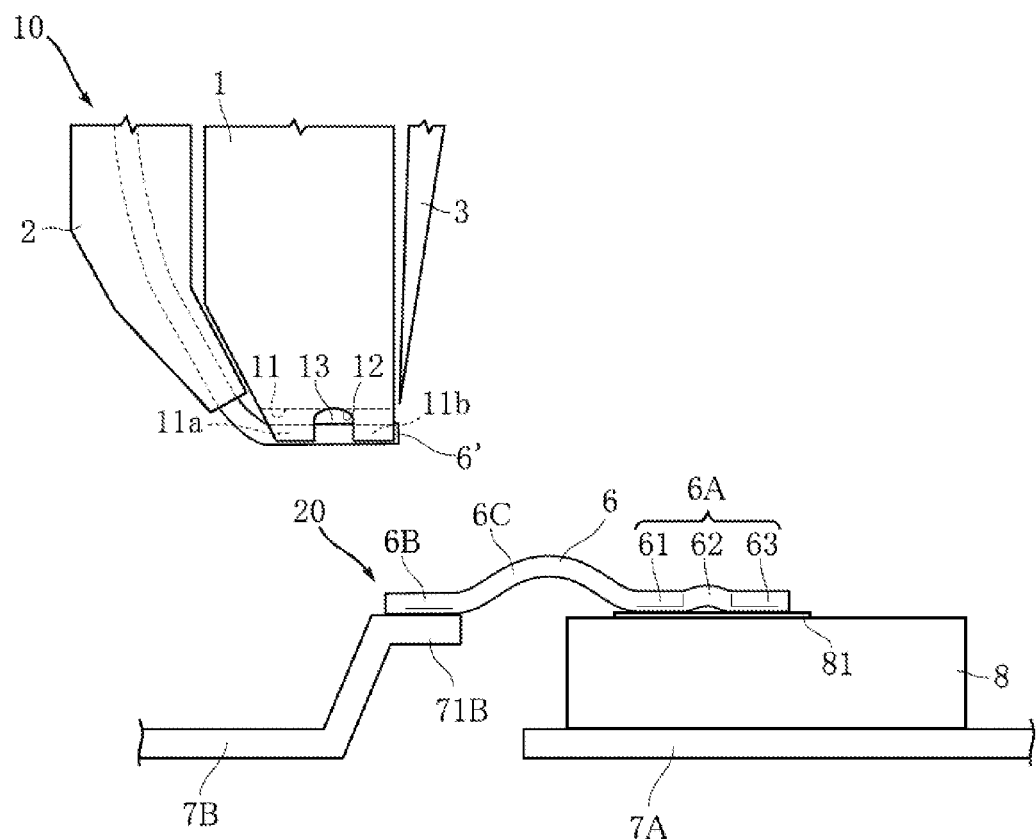
FIG. 10 is a side view showing the state where the wire bonding work is finished.

Thereafter, as shown in FIG. 10, the wire 6', along with the wedge 1, is separated from the pad portion 71B. By this process, the wire 6' is cut at the above-described cut portion and becomes the wire 6 connecting the electrode pad 81 and the pad portion 71B. By the wire bonding process described above, the wire bonding structure 20 shown in FIG. 10 is completed.

Figure 11:
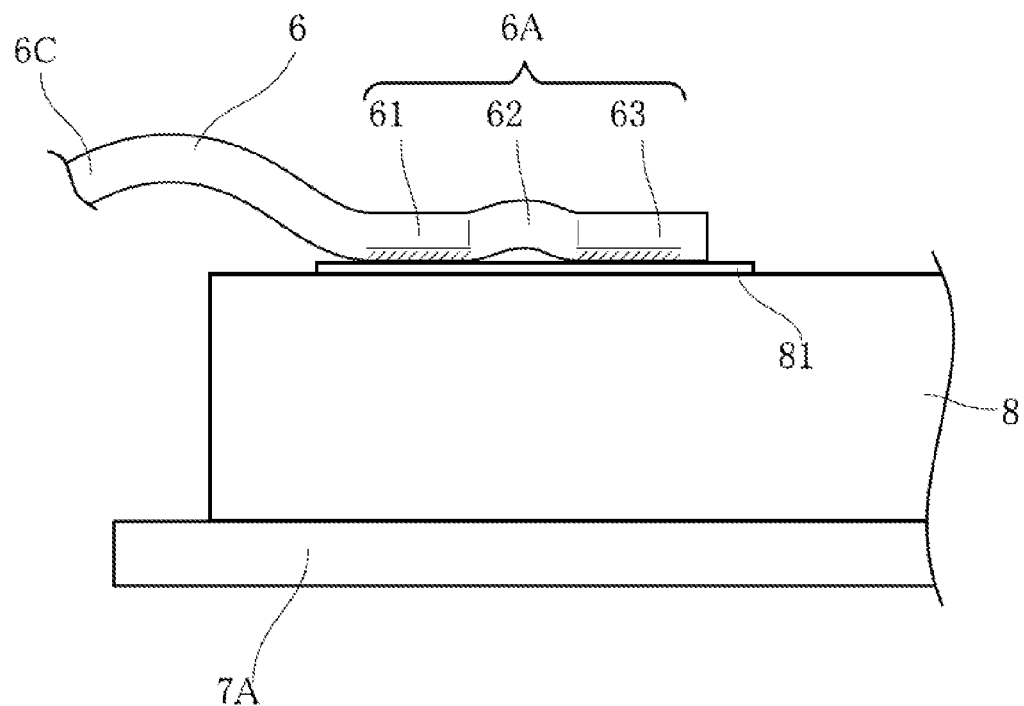
FIG. 11 is a side view showing the structure of a first bonding portion.
Figure 12:
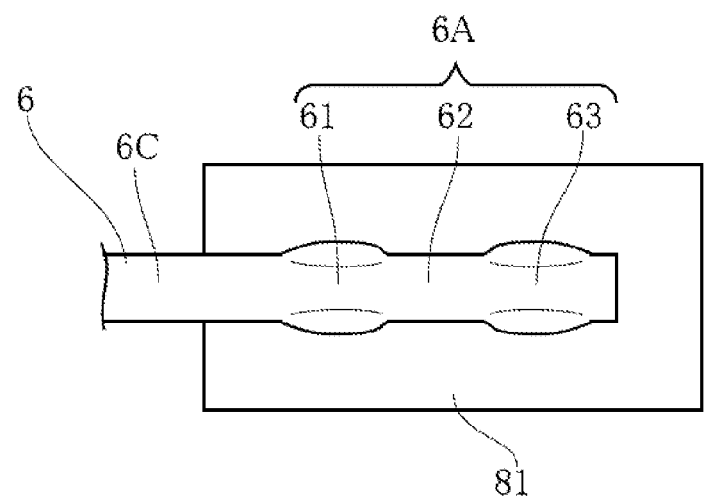
FIG. 12 is a plan view showing the structure of the first bonding portion.

The wire bonding structure 20 comprises the wire 6 including the first bonding portion 6A (bonded to the electrode pad 81 of the semiconductor element 8), the second bonding portion 6B (bonded to the pad portion 71B), and a bridge portion 6C connecting these bonding portions. FIGS. 11 and 12 show the first bonding portion 6A in more detail. The shaded portions in FIG. 11 are the front bond portion 61 and the rear bond portion 63, which are firmly bonded to the electrode pad 81. Since the front bond portion 61 and the rear bond portion 63 have been pressed by the wedge 1, these portions have a little wider shape, as shown in FIG. 12. Since the intermediate portion 62 is a portion which has been positioned within the gap 13, the degree of deformation of the intermediate portion 62 is considerably small as compared with the front bond portion 61 and the rear bond portion 63. In this embodiment, the front bond portion 61, the rear bond portion 63 and the intermediate portion 62 are substantially equal to each other in length in the front-rear direction of the intermediate portion 62 (longitudinal direction of the wire 6).

The advantages of the wire bonding tool 10 and wire bonding method using the tool are described below.

As noted before, while the first bonding portion 6A is formed by using both of the front pressing surface 11a and the rear pressing surface 11b, the second bonding portion 6B is formed by using the rear pressing surface 11b only. Thus, the length of the second bonding portion 6B in the front-rear direction (longitudinal direction of the wire 6) is smaller than that of the first bonding portion 6A. In this embodiment, the length of the second bonding portion 6B is about ⅓ of that of the first bonding portion 6A. Thus, it is possible to make the length of the pad portion 71B about ⅓ of that of the electrode pad 81 while securing a sufficient bonding area between the first bonding portion 6A and the electrode pad 81. Accordingly, the entire semiconductor device including the semiconductor element 8 can be reduced in size.

The provision of the guide groove 11 allows the wedge 1 to reliably hold the wire 6'. The provision of the cutouts 12 reliably separate the front pressing surface 11a and rear pressing surface 11b. The size of the gap 13 can be adjusted by appropriately setting the shape and size of the cutouts 12, so that the rising amount of the intermediate portion 62 of the first bonding portion 6A from the electrode pad 81 is adjustable.

Of the wire 6', the portion immediately in front of the second bonding portion 6B is not bonded to the pad portion 71B. The formation of a cut in this portion using a cutter 3 ensures that the wire 6' is properly cut by subsequently separating the bonding tool 10 from the pad portion 71B. Since the cutter 3 is fixed (rigidly attached) to the support 4, the cut can be formed in the wire 6' just by moving the support 4 downward. This is suitable for simplifying the entire structure, as compared with a structure provided with a driving source used exclusively for driving the cutter 3.

Figure 13:
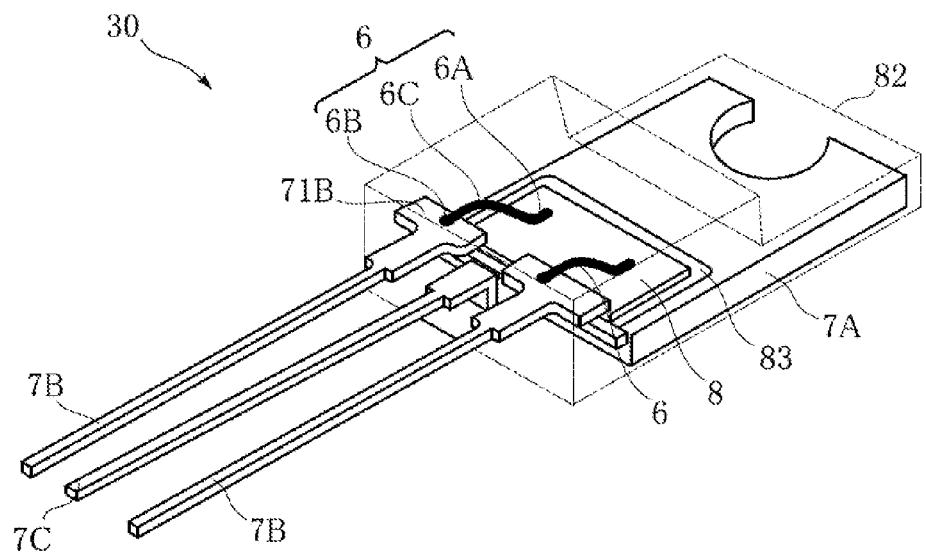
FIG. 13 is a perspective view showing an example of semiconductor device according to the present invention.

FIG. 13 shows an example of semiconductor device according to the present invention. The semiconductor device 30 of this embodiment includes a semiconductor element 8, a plurality of leads 7A, 7B, 7C, two wires 6 and a resin package 82 and is structured as a three-terminal schottky barrier diode, for example. In particular, in the case of a power schottky barrier diode, the reverse voltage (DC) is about 30 to 100 V, and the average rectified forward current is about 5 to 30 A. In FIG. 13, illustration of the electrode pad (reference number 81 in the foregoing embodiment) of the semiconductor element 8 is omitted.

The semiconductor element 8 is die-bonded to the lead 7A via a die-bonding material 83. The electrode pad (not shown) of the semiconductor element 8 and the pad portion 71B of each lead 7B are connected to each other via a wire 6. Each wire 6 includes the above-described first bonding portion 6A, second bonding portion 6B and bridge portion 6C. For instance, the lead 7C is a cathode common terminal. The resin package 82 is made of e.g. black epoxy resin and covers the entirety of the semiconductor element 8, wire 6 and lead 7A and part of the leads 7B, 7C.

Generally, in the case of a resin packaged semiconductor device like the semiconductor device 30, the size and shape of the resin package 82 is standardized and cannot be changed as desired. As noted before, the structure in which the second bonding portion 6B is made smaller than the first bonding portion 6A (e.g. the length being about ⅓) allows the pad portion 71B to be made small relative to the semiconductor element 8. Thus, the pad portion 71B fills a relatively small space of a given volume of the resin package 82, which allows the accommodation of a larger semiconductor element 8. Thus, a high-power semiconductor element 8 can be employed, which is advantageous.

Figure 14:
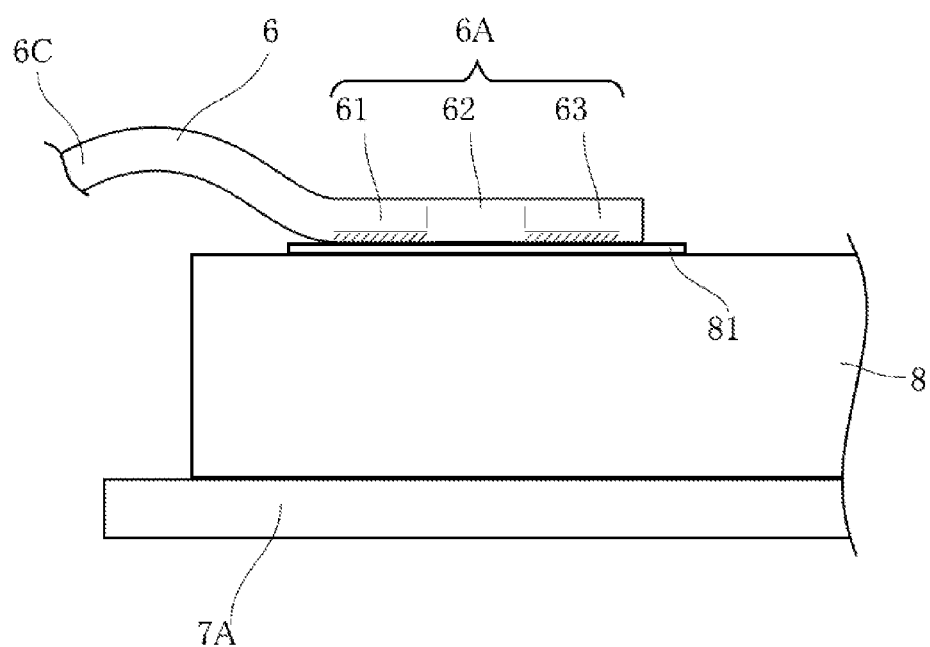
FIG. 14 is a side view showing another structure of a first bonding portion.
Figure 15:
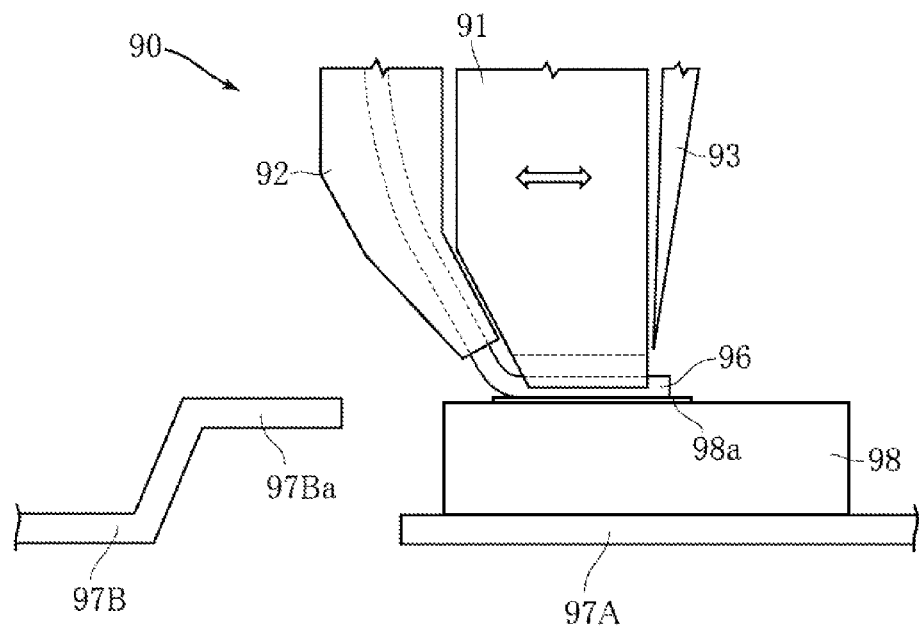
FIG. 15 is a side view showing a first bonding step in a conventional wire bonding method.
Figure 16:
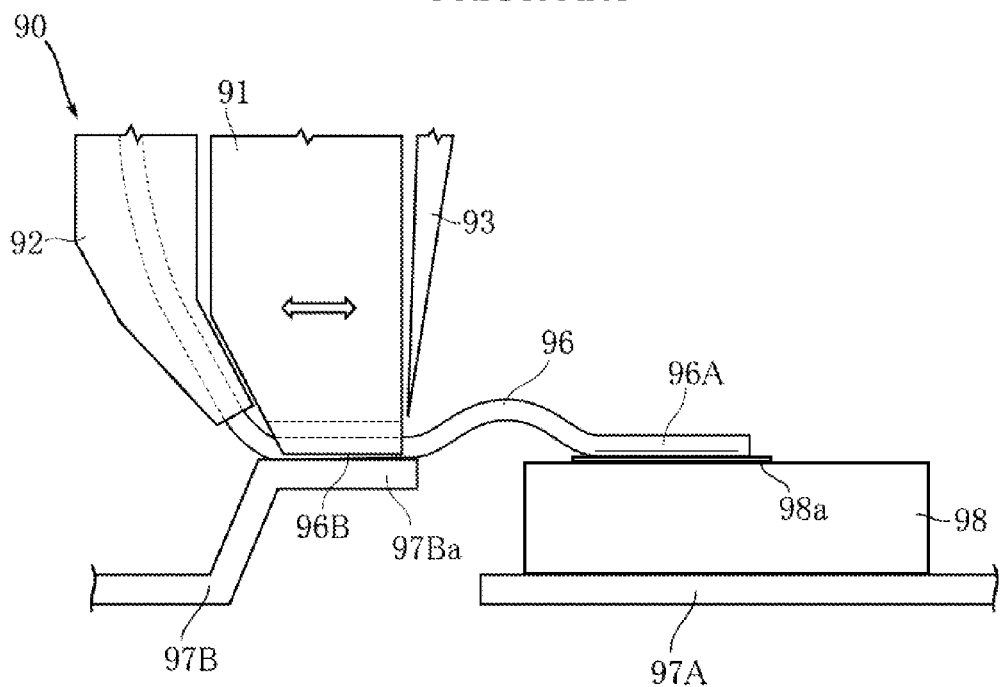
FIG. 16 is a side view showing a second bonding step in the conventional wire bonding method.

FIG. 14 shows another example of wire bonding structure according to the present invention. In this figure, the elements that are identical or similar to those of the foregoing embodiments are designated by the same reference signs as those used for the foregoing embodiments.

This embodiment is different from the foregoing embodiments in structure of the intermediate portion 62. Specifically, the intermediate portion 62 of this embodiment does not have an arch-like shape, but is substantially straight. The intermediate portion 62 and the electrode pad 81 are in contact with each other, with almost no space defined between them. However, unlike the front bond portion 61 and the rear bond portion 63, the intermediate portion 62 is not welded to the electrode pad 81. This intermediate portion 62 can be provided by making the cutouts 12 of the wedge 1 appropriately smaller than that of the above-described structure.

This embodiment also achieves size reduction of the semiconductor device including the semiconductor element 8. Moreover, the increased contact area between the first bonding portion 6A and the electrode pad 81 achieves a reduced resistance.

As will be understood from the foregoing embodiments, the cutouts 12 may have any size as long as it can provide a portion (non-welded portion or weakly welded portion) that can be cut properly by making a cut in the wire 6' with a cutter 3. Thus, the intermediate portion 62 may have an arch-like shape, a straight shape or other shapes. In another example of structure, the intermediate portion 62 may be welded to the electrode pad 81, though not so strongly as the front bond portion 61 and the rear bond portion 63. This structure can also be employed as long as the welding of the intermediate portion is of such a degree that the wire 6' can be cut properly after second bonding.

The invention claimed is:

1. A wire bonding structure comprising a wire that comprises:
   a first bonding portion bonded to a first bonding target; and
   a second bonding portion bonded to a second bonding target;
   wherein the first bonding portion includes a front bond portion, a rear bond portion, and an intermediate portion between the front bond portion and the rear bond portion, the front bond portion being closer to the second bonding portion than the rear bond portion is, each of the front bond portion and the rear bond portion having a bonding surface and an upper outline opposite to the bonding surface, the bonding surface being bonded to the first bonding target more strongly than the intermediate portion is, wherein the second bonding portion is smaller in bonding length in a longitudinal direction of the wire than the first bonding portion, wherein the first bonding portion is provided at an end of the wire, wherein the intermediate portion has an under outline facing the first bonding target and extending from the rear bond portion to the front bond portion, and the entirety of the under outline of the intermediate portion is closer to the first bonding target than is the upper outline of each of the front bond portion and the rear bond portion, and wherein the intermediate portion is smaller in width than each of the front bond portion and the rear bond portion as viewed in a normal direction of the first bonding target.

2. The wire bonding structure according to claim 1, wherein the intermediate portion is spaced apart from the first bonding target.

3. The wire bonding structure according to claim 2, wherein the intermediate portion has a circular cross section, and a spacing distance between the intermediate portion and the first bonding target is smaller than a diameter of the circular cross section.

4. The wire bonding structure according to claim 1, wherein the intermediate portion is in direct contact with the first bonding target.

5. The wire bonding structure according to claim 1, wherein the second bonding portion is equal in bonding length in the longitudinal direction of the wire to the rear bond portion of the first bonding portion.

6. The wire bonding structure according to claim 5, wherein the second bonding portion has a bonding length that is ⅓ of a length of the first bonding portion in the longitudinal direction of the wire.

7. The wire bonding structure according to claim 1, wherein the wire is made of aluminum.

8. A semiconductor device comprising:
a wire bonding structure as set forth in claim 1;
a semiconductor element including an electrode pad as the first bonding target;
a lead including a pad portion as the second bonding target; and
a resin package covering the semiconductor element and the wire bonding structure.

9. The wire bonding structure according to claim 1, wherein the first bonding target is a single electrode pad to which both the front bond portion and the rear bond portion are bonded.

10. The wire bonding structure according to claim 1, wherein the intermediate portion is equal in length to at least one of the front bond portion and the rear bond portion in the longitudinal direction of the wire.

11. The wire bonding structure according to claim 1, wherein each of the front bond portion and the rear bond portion is welded to the first bonding target.

12. The wire bonding structure according to claim 1, wherein a longitudinal direction of the front bond portion coincides with a longitudinal direction of the rear bond portion.

13. The wire bonding structure according to claim 1, further comprising a bridge portion connecting the first bonding portion and the second bonding portion to each other, wherein the bridge portion is greater in length than the intermediate portion.

14. The wire bonding structure according to claim 13, wherein the bridge portion is greater in length than the first bonding portion.

15. A wire bonding structure comprising a wire that comprises:
a first bonding portion bonded to a first bonding target; and
a second bonding portion bonded to a second bonding target;
wherein the first bonding portion includes a front bond portion, a rear bond portion, and an intermediate portion between the front bond portion and the rear bond portion, the front bond portion being closer to the second bonding portion than the rear bond portion is, each of the front bond portion and the rear bond portion having a bonding surface and an upper outline opposite to the bonding surface, the bonding surface being bonded to the first bonding target more strongly than the intermediate portion is,
wherein the second bonding portion is smaller in bonding length in a longitudinal direction of the wire than the first bonding portion,
wherein the first bonding portion is provided at an end of the wire,
wherein the intermediate portion has an under outline facing the first bonding target and extending from the rear bond portion to the front bond portion, and the entirety of the under outline of the intermediate portion is closer to the first bonding target than is the upper outline of each of the front bond portion and the rear bond portion, and
wherein each of the front bond portion and the rear bond portion includes a thick part and a pair of thin parts that flank the thick part and are smaller in thickness than the thick part.

16. The wire bonding structure according to claim 15, wherein each of the thin parts of the front bond portion and the rear bond portion has a flat face that is spaced apart from and parallel to the first bonding target.

17. The wire bonding structure according to claim 16, wherein the flat faces of each of the thin parts of the front bond portion are flush with the flat faces of each of the thin parts of the rear bond portion.

18. A method of forming a wire bonding structure including a first bonding portion and a second bonding portion, the method comprising:
forming the first bonding portion on a first bonding target; and
forming the second bonding portion on a second bonding target spaced apart from the first bonding target;
wherein the first bonding portion includes a front bond portion, a rear bond portion and an intermediate portion disposed between the front bond portion and the rear bond portion, the front bond portion and the rear bond portion being spaced apart from each other and both bonded to the first bonding target,
wherein the front bond portion and the second bond portion are simultaneously welded to the first bonding target, while the intermediate portion is unbonded to the first bonding target, and
wherein the intermediate portion is smaller in width than each of the front bond portion and the rear bond portion as viewed in a normal direction of the first bonding target.

19. The method according to claim 18, wherein the intermediate portion is equal in length to at least one of the front bond portion and the rear bond portion.

* * * * *